(12) United States Patent
Aoki

(10) Patent No.: US 6,979,781 B2
(45) Date of Patent: Dec. 27, 2005

(54) SEMICONDUCTOR PACKAGE, ELECTRONIC CIRCUIT DEVICE, AND MOUNTING METHOD OF SEMICONDUCTOR DEVICE

(75) Inventor: Kenji Aoki, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/882,204

(22) Filed: Jul. 2, 2004

(65) Prior Publication Data

US 2005/0051352 A1    Mar. 10, 2005

(30) Foreign Application Priority Data

Jul. 3, 2003    (JP)    ............... 2003-191263

(51) Int. Cl.$^7$ ............... H01L 23/28; H05K 5/06

(52) U.S. Cl. ............... 174/52.2; 174/52.4; 361/770

(58) Field of Search ............... 257/737, 781, 257/738, 778; 174/52.4; 361/770

(56) References Cited

U.S. PATENT DOCUMENTS

| | | | | |
|---|---|---|---|---|
| 4,833,570 A | * | 5/1989 | Teratani | 361/770 |
| 5,255,159 A | * | 10/1993 | Seyk | 361/770 |
| 5,489,752 A | * | 2/1996 | Cognetti et al. | 174/266 |
| 5,495,395 A | * | 2/1996 | Yoneda et al. | 361/765 |
| 5,528,462 A | * | 6/1996 | Pendse | 361/767 |
| 5,684,677 A | * | 11/1997 | Uchida et al. | 361/770 |
| 5,751,556 A | * | 5/1998 | Butler et al. | 361/773 |
| 5,886,878 A | * | 3/1999 | Khadem et al. | 361/770 |
| 6,156,408 A | * | 12/2000 | Zhou et al. | 428/131 |

FOREIGN PATENT DOCUMENTS

JP    11-163186    6/1999

* cited by examiner

Primary Examiner—Hung V. Ngo
(74) Attorney, Agent, or Firm—Finnegan, Henderson, Farabow, Garrett & Dunner, L.L.P.

(57) ABSTRACT

A semiconductor package has first and second surfaces and has a plurality of pedestals disposed on the first surface, for keeping a certain height of the semiconductor package after mounting.

11 Claims, 4 Drawing Sheets

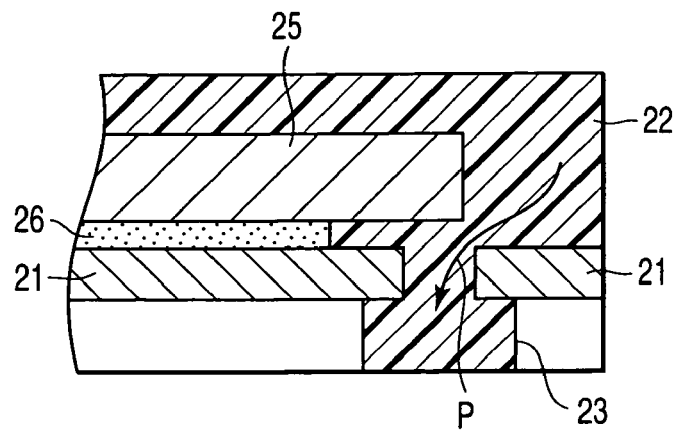
F I G. 7
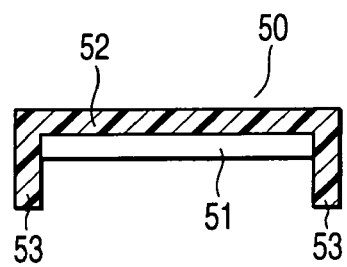
F I G. 8
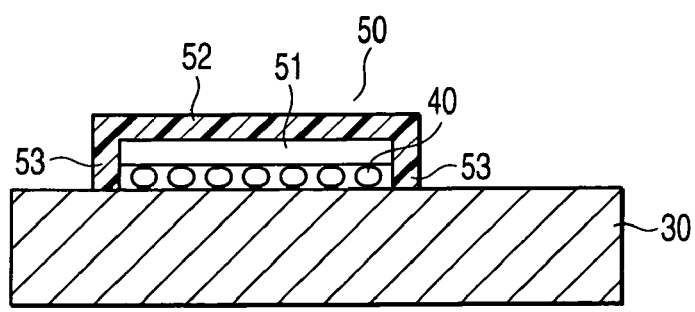
F I G. 9

SEMICONDUCTOR PACKAGE, ELECTRONIC CIRCUIT DEVICE, AND MOUNTING METHOD OF SEMICONDUCTOR DEVICE

CROSS-REFERENCE TO RELATED APPLICATIONS

This application is based upon and claims the benefit of priority from prior Japanese Patent Application No. 2003-191263, filed Jul. 3, 2003, the entire contents of which are incorporated herein by reference.

BACKGROUND OF THE INVENTION

1. Field of the Invention

The present invention relates to a semiconductor package preferably applied to electronic apparatuses such as a personal computer, an electronic circuit device, and a mounting method of a semiconductor device.

2. Description of the Related Art

In recent years, in electronic apparatuses in which a plurality of semiconductor devices are mounted therein, such as a personal computer and a wireless communication apparatus, in order to meet a demand for miniaturization, electronic components to be built in have been miniaturized, the number of pins have been increased, and a semiconductor package has increasingly tended to be thinned among the electronic components. In the semiconductor package, a warp preventive countermeasure, for example, by reflow soldering at the time of solder mounting is required, and various countermeasures have been proposed (see Jpn. Pat. Appln. KOKAI Publication No. 11-163186, for example).

To realize further thinning of the semiconductor package, structural changes for thinning all constituting elements as objects are required such as reduction of a chip thickness or a mold resin thickness, and stopping of a solder ball.

Under an influence of the structural change, the semiconductor package is further easily warped or twisted at the time of the solder mounting. Therefore, with only the existing countermeasure, the soldering is not achieved, solder shortage is generated in the vicinity of a corner pad, or further the package is sometimes warped or twisted. Accordingly, there is a problem that heights of the mounted components are misaligned or increase. Especially when a large number of remarkably thinned semiconductor packages are mounted on predetermined circuit substrates such as a mother board, dimensional accuracy of the board after mounting the package is influenced by the warps of the semiconductor packages, or misaligned mounting height by occurrence of the twisting.

As described above, there has been a demand for further highly reliable mounting technique with the thinning of the semiconductor package in the mounting technique of the semiconductor package.

BRIEF SUMMARY OF THE INVENTION

A semiconductor package having first and second surfaces according to a first aspect of the present invention is characterized by comprising: a plurality of pedestals disposed on the first surface, for keeping a certain height of the semiconductor package after mounting.

An electronic circuit device according to a second aspect of the present invention is characterized by comprising: a mother board; a semiconductor package comprising a substrate mounting a semiconductor chip; and a spacer for keeping a mounting height of the substrate of the semiconductor package a certain height from the mother board.

A mounting method of a semiconductor package according to a third aspect of the present invention is characterized by comprising: providing a plurality of spacers to keep a height of a semiconductor package after mounting to be constant on either one of a mounting surface of one surface of the semiconductor package or a mounting surface of the semiconductor package of a main substrate; and soldering/mounting the semiconductor package onto the main substrate via the plurality of spacers.

BRIEF DESCRIPTION OF THE SEVERAL VIEWS OF THE DRAWING

FIG. 7 is a diagram showing a molding example of the stand-off (pedestal) in the first embodiment;

FIG. 8 is a diagram showing a configuration of the semiconductor package in a second embodiment of the present invention;

FIG. 9 is a diagram showing a mounted state of the semiconductor package in the second embodiment;

DETAILED DESCRIPTION OF THE INVENTION

Embodiments of the present invention will be described hereinafter with reference to the drawings.

Figure 1A:
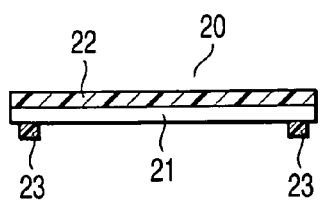
FIGS. 1A to 1C are diagrams showing a configuration of a semiconductor package in a first embodiment of the present invention.
Figure 1B:
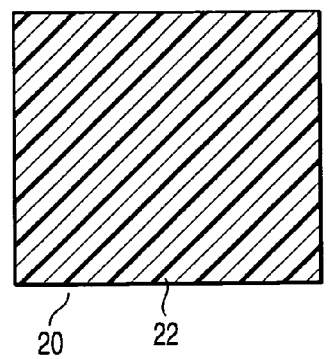
Figure 1C:
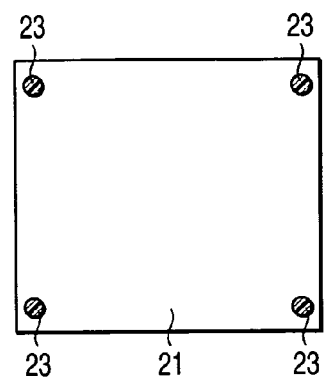

FIGS. 1A to 1C are diagrams showing a configuration of a semiconductor package in a first embodiment of the present invention. FIG. 1A is a sectional view, FIG. 1B is a top plan view, and FIG. 1C is a bottom plan view. In this specification, the "semiconductor package" contains a package mounting the IC configured of a single chip, a package which is called a multi-IC chip, and a semiconductor package which is mounted on the motherboard by soldering such as CPU sockets.

A semiconductor package 20 includes a substrate 21 and a mold resin 22. The back surface of the substrate 21 forms that of the semiconductor package 20.

A plurality of stand-offs (pedestals) 23 (four stand-offs in the drawing) each having a predetermined certain height (thickness) are disposed in four corners of the substrate 21. An example for forming the stand-offs 23 will be described later.

A semiconductor chip (not shown) mounted on the substrate 21 is coated with the mold resin 22. In the first embodiment, the stand-offs 23 are formed simultaneously at the time of the molding of the mold resin 22.

Figure 2A:
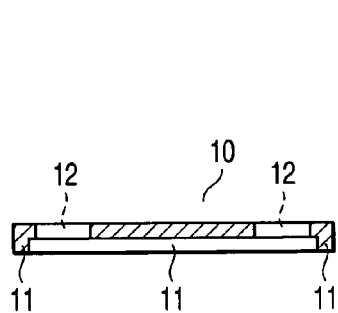
FIGS. 2A to 2C are diagrams showing a configuration of a warp preventive cover in the first embodiment.
Figure 2B:
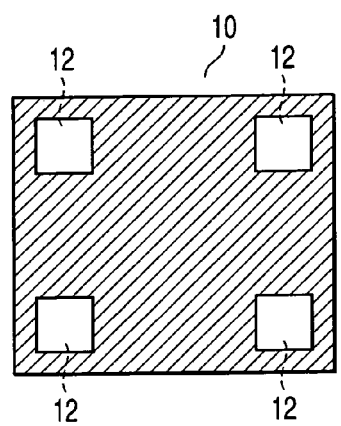
Figure 2C:
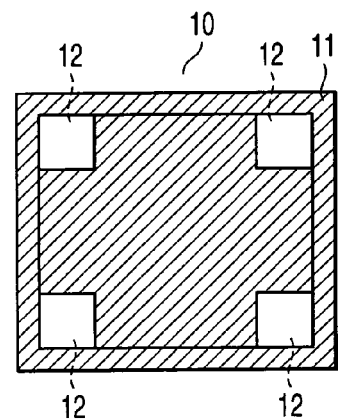

FIGS. 2A to 2C are diagrams showing a configuration of a warp preventive cover in the first embodiment. FIG. 2A is a sectional view, FIG. 2B is a top plan view, and FIG. 2C is a bottom plan view.

A warp preventive cover 10 includes a flange portion 11 and openings 12. The warp preventive cover 10 is obtained, for example, by working/forming a metal thin plate of stainless steel.

The warp preventive cover 10 is detachably attached onto the upper surface of the semiconductor package 20, and the semiconductor package 20 has a function of suppressing warp and twist caused at the time of solder mounting, for example, by reflow soldering.

The flange portion 11 has a function of holding the warp preventive cover 10 on the semiconductor package 20, when the upper surface of the semiconductor package 20 is covered with the warp preventive cover 10.

The openings 12 avoid thermal deformation of the warp preventive cover 10 at the solder mounting time, and secures a holding force by the flange portion 11. This also facilitates a detaching operation of the warp preventive cover 10 at the solder mounting time.

Figure 3:
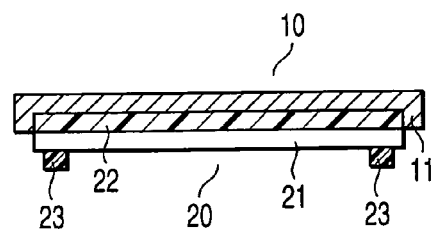
FIG. 3 is an explanatory view of a solder mounting step of the semiconductor package in the first embodiment.
Figure 4:
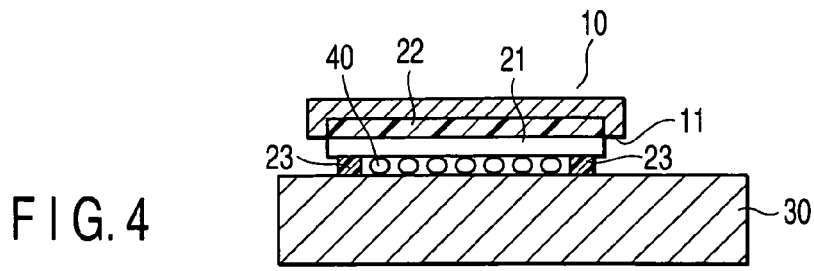
FIG. 4 is an explanatory view of the solder mounting step of the semiconductor package in the first embodiment.
Figure 5:
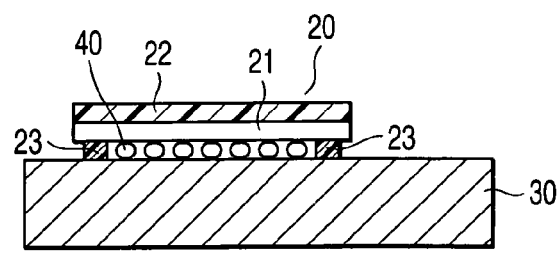
FIG. 5 is an explanatory view of the solder mounting step of the semiconductor package in the first embodiment.

FIGS. 3 to 5 are explanatory views of a solder mounting step of the semiconductor package 20 in the first embodiment. Each state of the step is shown in a sectional view.

FIG. 3 shows that the semiconductor package 20 is covered with the warp preventive cover 10. FIG. 4 shows that the semiconductor package 20 covered with the warp preventive cover 10 is solder-mounted on a mother board (main substrate) 30. FIG. 5 shows a state (state in which the warp preventive cover 10 is removed from the semiconductor package 20) after solder-mounting the semiconductor package 20 onto the mother board (main substrate) 30.

When the semiconductor package 20 provided with the stand-offs 23 is soldered/mounted onto the mother board (main substrate) 30 by the reflow soldering or the like, as shown in FIG. 3, the upper surface of the semiconductor package 20 constituting a soldering object is covered with the warp preventive cover 10. It is to be noted that it is also possible to dispose the warp preventive cover 10 beforehand in a manufacturing process of the semiconductor package 20.

Next, as shown in FIG. 4, the semiconductor package 20 covered with the warp preventive cover 10 is mounted on the mother board (main substrate) 30, and the solder mounting (solder bonding between electrode and pad by molten solder) is performed, for example, on a solder reflow line.

After soldering/mounting the semiconductor package 20 onto the mother board 30, as shown in FIG. 5, the warp preventive cover 10 is detached from the semiconductor package 20 mounted on the mother board 30.

In the soldering step shown in FIG. 4, when the semiconductor package 20 is mounted on the mother board 30, and the pads are soldered/bonded to each other by the melting of the solder, an appropriate solder bond interval is kept between a package mounting surface of the mother board 30 and a solder bond surface of the substrate 21 by the bottom surface of the semiconductor package 20, that is, the stand-offs 23 disposed in four corners of the bottom surface of the substrate 21. Accordingly, the height of the semiconductor package 20 mounted on the mother board 30 can be set to be constant. In this specification, following explanation will be made such that an interval between the package mounting surface of the mother board 30 and the solder bond surface of the substrate 21, and a height of the semiconductor ship of the semiconductor package 20 mounted on the motherboard 30 (That is, the height of the semiconductor package 20 mounted on motherboard 30) are not distinguished, except for especially describing the explanation. Therefore, the warp and twist can be controlled from being caused, further the appropriate solder bond interval is secured, and accordingly highly reliable soldering/mounting is performed.

Figure 6:
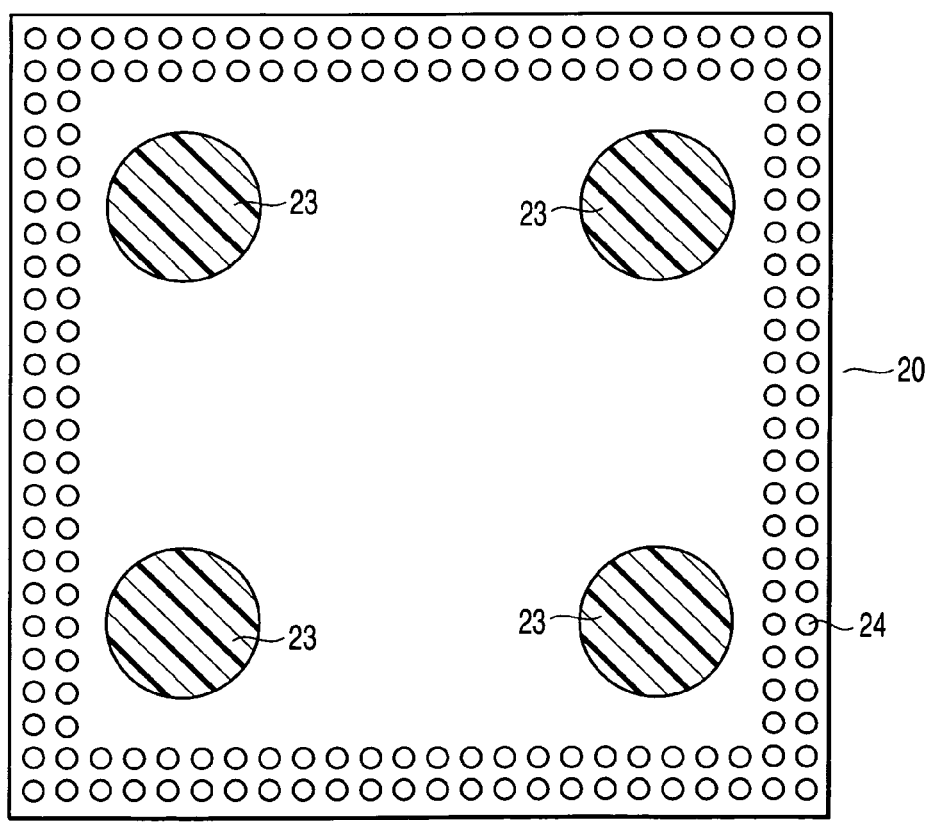
FIG. 6 is a diagram showing a concrete arrangement example of stand-offs (pedestals) of the semiconductor package in the first embodiment.

A concrete arrangement example of the stand-offs 23 disposed on the semiconductor package 20 in the first embodiment is shown in FIG. 6. A molding example of the stand-off is shown in FIG. 7. In the example shown in FIG. 6, the stand-offs 23 each having a certain height (thickness) are disposed in four corners inside pads (pads for electrode connection) 24 disposed along sides of the bottom surface of the substrate 21 forming the bottom surface of the semiconductor package 20.

In the molding example of the stand-off 23 shown in FIG. 7, in a manufacturing process of the semiconductor package, holes are made in four corners of the substrate 21, a sealing resin flows out of the bottom surface of the substrate 21 through a hole (passage) P formed by hole-making working at the time of mold resin molding, and accordingly the stand-offs 23 are formed. Therefore, in this example, the stand-offs 23 are formed integrally with the mold resin 22 with which the semiconductor chip is coated.

FIG. 8 is a sectional view showing a configuration of the semiconductor package in a second embodiment of the present invention.

A semiconductor package 50 includes a substrate 51 and a mold resin 52. The back surface of the substrate 51 forms that of the semiconductor package 50.

A semiconductor chip (not shown) is mounted on the substrate 51, and the semiconductor chip mounted on the substrate 51 is coated with the mold resin 52. Furthermore, the mold resin 52 protrudes downwards from an outer peripheral edge of the substrate 51 to form a stand-off (pedestal) 53. That is, in the second embodiment, the stand-off 53 is protruded downwards from the outer peripheral edge of the substrate 51 and simultaneously formed at the time of the molding of the mold resin of the semiconductor chip mounted on the substrate 51. Four stand-offs 53 may be disposed in corner portions of the outer peripheral edge of the substrate 51 under the outer peripheral edge of the substrate 51, the stand-off may be disposed in each of positions of predetermined three sides of the outer peripheral edge of the substrate 51, or the stand-off may be disposed in a middle portion of each side of the outer peripheral edge of the substrate 51.

A mounted state of the semiconductor package in the second embodiment is shown in FIG. 9.

In the semiconductor package 50 in the second embodiment, on the mother board (main substrate) 30, an appropriate solder bond interval is kept between the package mounting surface of the mother board 30 and the solder bond surface of the substrate 51 by the stand-off 53, and the package mounting surface of the mother board 30 is soldered to the solder bond surface of the substrate 51 by a solder 40 while keeping the appropriate solder bond interval between the surfaces.

Accordingly, the height of the semiconductor package 50 mounted on the mother board 30 can be set to be constant.

Therefore, the warp and twist can be controlled from being caused, further the appropriate solder bond interval is secured, and accordingly the highly reliable soldering/mounting is performed.

In the first embodiment and the second embodiment, a plurality of stand-offs are provided to the semiconductor package, and the height thereof after mounting the semiconductor package is made constant. In the third embodiment, an embodiment, which makes the height after mounting the semiconductor package constant without providing the stand-offs to the semiconductor package will be explained. A structure that the stand-offs are not provided like the third embodiment is called "landless" structure in the specification.

Since the appropriate solder bond interval cannot be secured when soldering is performed without support members in the semiconductor package using the landless structure, it is difficult to secure the reliability of the solder mounting. Therefore, in the semiconductor package using the landless structure, the technology, which can make the height after mounting the semiconductor package constant, is necessary. In the third embodiment, this problem is solved, for instance, by positioning (spreading, coating, flashing, etc.) the studs as a spacer. The third embodiment will be explained in detail as follows.

Figure 10A:
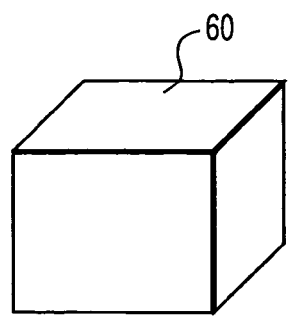
FIG. 10A and FIG. 10B are figures which show a configuration of stud according to the third embodiment.
Figure 10B:
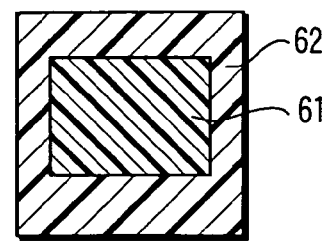
Figure 11:
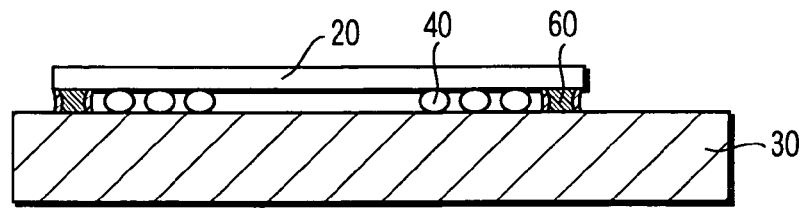
FIG. 11 is a figure to explain a mounting method of the semiconductor package in the third embodiment.
Figure 12:
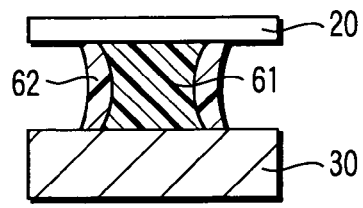
FIG. 12 is a figure which shows details in the stud in FIG. 11.

The stud 60 has a cubic heat stiffening resin 61 which is used as a core and insulation resin 62 covering the outside of the heat stiffening resin 61, as shown in FIG. 10A and FIG. 10B. It is desirable that the insulation resin 62 has a high viscosity. When the semiconductor package 20 is mounted, the plurality of studs 60 are positioned using the dispenser etc. at a predetermined position on the motherboard 30 after printing the solder paste. Thereafter, as shown in FIG. 11, the semiconductor package is mounted on the motherboard to cover the plurality of studs 60 and soldering/mounting is performed on, for instance, the solder reflow line. At this time, the insulation resin 62 melts previously and is stiffened as shown in FIG. 12, and, next, the heat stiffening resin 61 is used as a core to suppress sinking of the semiconductor package 20. As a result, the height after mounting the semiconductor package can be made constant.

Figure 13A:
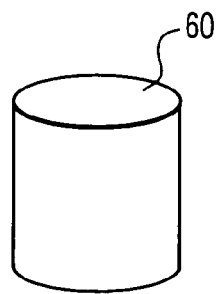
FIG. 13A and FIG. 13B are modification of the stud.
Figure 13B:
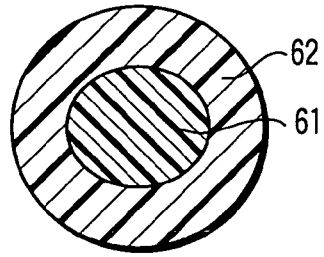

The shape of each stud 60 is not limited to the cube like the above-mentioned. For instance, a stud having any shapes to make the height of the semiconductor package after mounting constant such as a columnar stud (see FIG. 13A and FIG. 13B), a spherical stud, and a multiplicity pillar may be used.

According to the embodiment of the present invention, the height of the mounted semiconductor package can be set to be constant, further the appropriate solder bond interval is kept, dimensional accuracy of the board (circuit substrate) on which the semiconductor package is mounted can be enhanced, the warp and twist can be controlled from being caused, the appropriate solder bond interval is secured, and accordingly a highly reliable soldering/mounting environment can be realized.

The pedestal is formed integrally with the mold resin with which the semiconductor chip is coated, and accordingly the pedestal can be formed in a simple and economically advantageous configuration.

A circuit of a device is constituted using the mother board on which the semiconductor package is mounted according to the embodiment of the present invention, accordingly the device can be miniaturized, and the operation is stabilized.

According to the mounting method of the semiconductor device of the embodiment of the present invention, in a relatively simple mounting step of the semiconductor package, the height of the mounted semiconductor package can be set to be constant, various soldering defects such as soldering shortage in the vicinity of a corner pad are avoided, and the highly reliable mounting of the semiconductor package is performed.

According to the embodiment of the present invention, the warp and twist caused at the time of the mounting of the semiconductor package are suppressed, the mounted height is set to be constant, and the dimensional accuracy of the board (substrate) on which the semiconductor package is mounted can be largely enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor package with first and second surfaces, comprising:
   a plurality of pedestals disposed on the first surface, to keep a certain height of the semiconductor package after mounting, wherein
   a sealing resin with which a semiconductor chip on the semiconductor package is coated is protruded downwards from an outer peripheral edge of a substrate of the semiconductor package to form the pedestals.

2. The semiconductor package according to claim 1, further comprising: a cover which is detachably attached to the second surface of the package to prevent the substrate from warping at a soldering/mounting time.

3. The semiconductor package according to claim 1, wherein the pedestals are formed integrally with a mold resin with which the semiconductor chip is coated.

4. The semiconductor package according to claim 1, wherein the sealing resin of a mold resin with which the semiconductor chip is coated flows out of the bottom surface of the package via passages disposed in the substrate to form the pedestals.

5. An electronic circuit device comprising:
   a mother board:
   a semiconductor package having a substrate mounting a semiconductor chip: and
   a spacer to keep a mounting height of the substrate of the semiconductor package a certain height from the mother board, wherein
   the spacer includes a plurality of studs positioned on a mounting surface of the semiconductor package of the mother board.

6. The electronic circuit device according to claim 5, wherein each of the plurality of studs includes a heat stiffening resin and an insulative resin which is formed to surround the heat stiffening resin.

7. The electronic circuit device according to claim 5, wherein the plurality of studs are formed integrally with a mold resin with which the semiconductor chip is coated.

8. The electronic circuit device according to claim 5, wherein a sealing resin with which the semiconductor chip is coated is protruded downwards from an outer peripheral edge of the substrate to form the plurality of studs.

9. A mounting method for a semiconductor package comprising:

provinding a plurality of spacers to keep a height of a semiconductor package after mounting to be constant on either one of a mounting surface of one surface of the semiconductor package or a mounting surface of the semiconductor package of a main substrate: and soldering/mounting the semiconductor package onto the main substrate via the plurality of spacers, wherein the spacers include a pedestal provided on the main substrate of the semiconductor package, and a sealing resin with which the semiconductor chip is coated is protruded downwards from an outer peripheral edge of the substrate to form the pedestal.

10. The mounting method according to claim 9, wherein the pedestal is formed integrally with a mold resin with which the semiconductor chip is coated.

11. The mounting method according to claim 9, further comprising: disposing a cover on the upper surface of the semiconductor package at the time of the soldering/mounting to prevent the package from warping at the time of the soldering/mounting.

* * * * *